(12) United States Patent
Goda et al.

(10) Patent No.: US 7,724,577 B2
(45) Date of Patent: May 25, 2010

(54) NAND WITH BACK BIASED OPERATION

(75) Inventors: Akira Goda, Boise, ID (US); Seiichi Aritome, Hsinchu (TW)

(73) Assignee: Micron Technology, Inc., Boise, ID (US)

( * ) Notice: Subject to any disclaimer, the term of this patent is extended or adjusted under 35 U.S.C. 154(b) by 188 days.

(21) Appl. No.: 12/117,314

(22) Filed: May 8, 2008

(65) Prior Publication Data

US 2009/0279359 A1    Nov. 12, 2009

(51) Int. Cl.
*G11C 11/34* (2006.01)

(52) U.S. Cl. .............................. 365/185.18; 365/185.11; 365/185.14; 365/185.17; 365/185.29; 365/185.23

(58) Field of Classification Search ............ 365/185.18, 365/185.11, 185.14, 185.17, 185.29, 185.23
See application file for complete search history.

(56) References Cited

U.S. PATENT DOCUMENTS

| | | | |
|---|---|---|---|
| 5,740,102 A * | 4/1998 | Kawashima | ................ 365/154 |
| 2007/0047327 A1 | 3/2007 | Goda | |
| 2008/0025097 A1 | 1/2008 | Aritome | |

* cited by examiner

*Primary Examiner*—Thong Q Le
(74) *Attorney, Agent, or Firm*—Leffert Jay & Polglaze, P.A.

(57) ABSTRACT

Methods of programming, reading and erasing memory cells are disclosed. In at least one embodiment, program, sense, and erase operations in a memory are performed with back biased operation, such as to improve high voltage device isolation and cutoff in string drivers and bit line drivers, and no nodes of the circuitry are biased at zero volts.

17 Claims, 4 Drawing Sheets

NAND WITH BACK BIASED OPERATION

FIELD

The present disclosure relates generally to semiconductor memories, and in particular, the present disclosure relates to NAND memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes, such as floating gates or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a data line, such as that commonly referred to as a bit line. In NAND flash architecture, a string of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density. Further, supply voltages are dropping, and there is an increased likelihood that leakage will occur given the tight controls on allowed voltages. This leads to problems with cutoff in string drivers, which drive the access line (e.g., word line) voltages of memories, and in cutoff of cells during boosting to decrease bit line to bit line leakage.

For the reasons stated above, and for other reasons stated below which will become apparent to those skilled in the art upon reading and understanding the present specification, there is a need in the art for memory devices having improved device isolation and cutoff performance.

DETAILED DESCRIPTION

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

Figure 1:
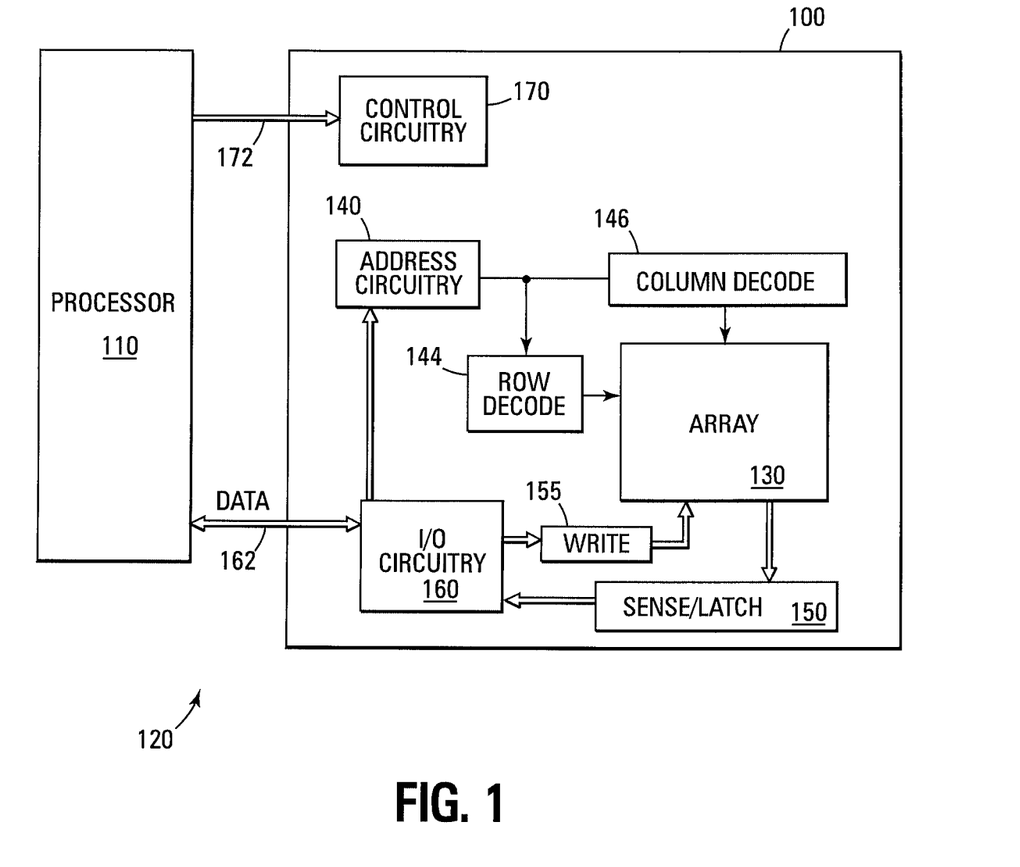
FIG. 1 is a functional block diagram of an electrical system having at least one memory device with a memory array configuration according to one embodiment of the present invention.

FIG. 1 is a functional block diagram of a memory device 100, such as a flash memory device, of one embodiment of the present invention, and on which various method embodiments may be practiced, which is coupled to a processor 110. The memory device 100 and the processor 110 may form part of an electronic system 120. The memory device 100 has been simplified to focus on features of the memory that are helpful in understanding the present invention. The memory device includes an array of memory cells 130 having bias conditions for program, read, and erase operations such as those shown in FIGS. 2-8 and described below. The memory array 130 is arranged in banks of rows and columns.

An address buffer circuit 140 is provided to latch address signals provided over I/O connections 162 through I/O circuitry 160. Address signals are received and decoded by row decoder 144 and a column decoder 146 to access the memory array 130. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 130 by sensing voltage or current changes in the memory array columns using sense/latch circuitry 150. The sense/latch circuitry, in one embodiment, is coupled to read and latch a row of data from the memory array. Data input and output buffer circuitry 160 is included for bi-directional data communication over a plurality of data (DQ) connections 162 with the processor 110, and is connected to write circuitry 155 and sense/latch circuitry 150 for performing read and write operations on the memory 100.

Command control circuit 170 decodes signals provided on control connections 172 from the processor 110. These signals are used to control the operations on the memory array 130, including data read, data write, and erase operations. The flash memory device has been simplified to facilitate a basic understanding of the features of the memory. A more detailed understanding of internal circuitry and functions of flash memories are known to those skilled in the art.

Figure 2:
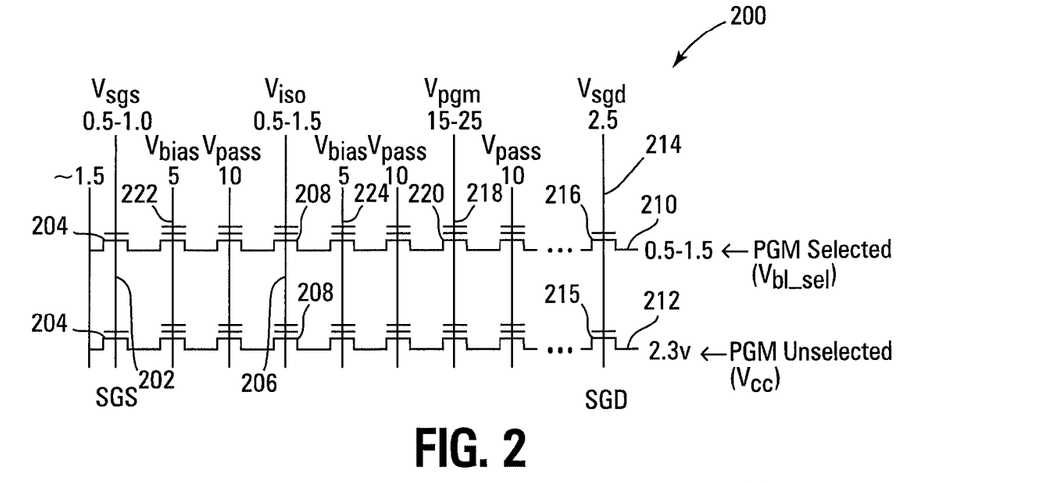
FIG. 2 is a diagram of a portion of a memory to be programmed according to an embodiment of the present invention.

Bias conditions placed on NAND strings 200 during programming of a selected block that is to be programmed are shown in more detail in FIG. 2. NAND strings 200 have a source select gate line connected to source select gates 204. A programming voltage Vpgm (typically 15 to 25 volts) is applied to program the selected word line 218. Program inhibit voltages are applied to all other word lines in the NAND string. Word line 206 is used to cut off the channel voltage to improve boosting efficiency. Non-zero bias Viso (typically 0.5 to 1.5 volts) is applied to the isolation word line 206. A program unselected bit line 212 is biased at Vcc (approximately 2.3 volts in one embodiment) to cut off select gate 215. Source select gate (SGS) line 202 and drain select gate (SGD) line 214 are biased at Vsgs (typically 0.5-1.0 volts) and Vsgd (typically 2.0-3.0 volts) respectively. Word lines 222 and 224 are biased at Vbias (approximately 5.0 volts). In this embodiment, program selected bit line 210 is biased at a non-zero bias Vbl_sel (typically 0.5-1.5 volts). By the application of non-zero bias on the program selected bit line 210, field isolation between memory cells is back biased. As one result, field leakage is reduced. In one embodiment, Viso is greater than 0 volts, and less than the program unselected bit line voltage (Vcc). The biases are maintained in one embodiment from the first program pulse of a progrmaming operation to the last program pulse in the programming operation. No ground node exists, that is, no bit line, word line, or select gate is at 0 volts during the programming operation from the first programming pulse to the last programming pulse.

Figure 3:
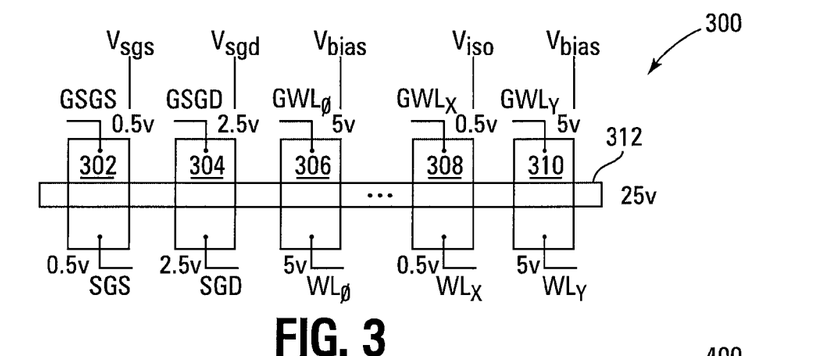
FIG. 3 is a diagram of a string driver of a memory to be programmed according to the embodiment of FIG. 2.

An associated string driver 300 for the program operation on the selected block of FIG. 2 is shown in FIG. 3. The string driver 300 is the device that drives the word lines (e.g., applies voltages to the word lines). Transistors 302, 304, 306, 308, and 310 of the string driver 300 are shown. The transistors 302, 304, 306, 308, and 310 share a common gate 312. Transistors 302, 304, 306, 308, and 310 correlate to those transistors shown on word lines 202, 214, 222, 206, and 224, respectively. In this embodiment for programming, a positive voltage is applied to the active area of the transistors, and a pass voltage of 25 volts is applied to the gate 312. If transistors 302 and 308 had a typical bias of 0 volts, then there would be a problem with potential leakage and field isolation issues. However, Vsgs and Viso bias (0.5-1.5 V) of transistors 302 and 308 results in a back biasing of the transistors, improving field isolation.

Figure 4:
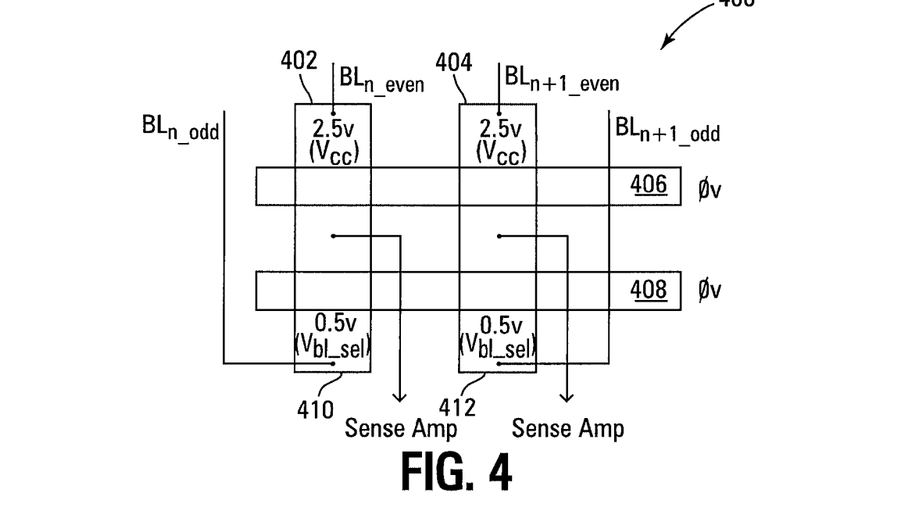
FIG. 4 is a diagram of a bit line driver of a memory to be programmed according to the embodiment of FIG. 2.

An associated bit line driver (wmux) 400 for the program operation on the selected block of FIG. 2 is shown in FIG. 4. The bit line driver (wmux) 400 is the device that drives the bit lines. Two transistors 402 and 404 are shown in FIG. 4, which is a top view. Each of the transistors 402 and 404 drives a bit line. In this embodiment, transistor 402 drives bit line n (both even and odd) and transistor 404 drives bit line n+1 (both even and odd). The gates 406 and 408 of the transistors are biased to 0 volts since during programming the transistors are in the off state. The voltage at the sources 410 and 412 is bit line select voltage Vbl_Sel (0.5-1.5 volts) in one embodiment. In typical previous designs, a source bias of 0 volts was typical, and with the gate to source voltage differential being 0 volts, leakage could occur. In the present embodiments, with the sources biased to 0.5-1.5 volts, there is an effective back bias, which is often referred to as reverse bias, of −0.5 volts on each gate to source connection. This can improve cutoff of the transistors of the bit line driver during programming.

A program operation of one embodiment provides positive biases, for the block to be programmed, on the select gate, the selected and unselected bit lines, the selected word line and the unselected word lines in the NAND string, and the common source. These positive biases result in no word line or bit line that is biased at ground. More specifically, programming according to one embodiment includes applying a positive bias to a select gate, applying a positive bias to a bit line of the string of the cell to be programmed, applying a positive bias to unselected program word lines, and applying a programming voltage to a cell to be programmed.

Figure 5:
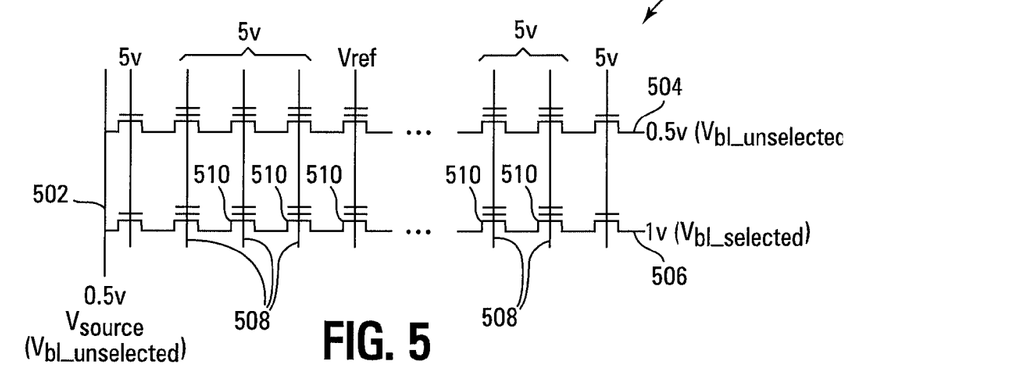
FIG. 5 is a diagram of a portion of a memory to be read according to an embodiment of the present invention.

A read circuit 500 is shown in greater detail in FIG. 5. In this embodiment, to read in a selected read block, a bias of 0.5 volts is placed on the common source 502, a bias of 0.5-2.5 volts (Vbl_unselected) is placed on the non-selected bit line (s) 504, and a bias of 1.0 volts is placed on the selected bit line 506. In prior configurations, the common source and non-selected bit lines were biased at 0 volts. A read pass voltage of approximately 5.0 volts is applied to the word lines 508 coupled to the string of cells 510 The same bias (Vbl_unselected) is applied to the source to prevent current flow on unselected bit lines. In bit line driver, 0.5 volts bias can improve isolation of the device as dicussed above. During a read operation, Atub can be biased at 0 volts or at Vbl_unselected (approximately 0.5 volts).

Figure 6:
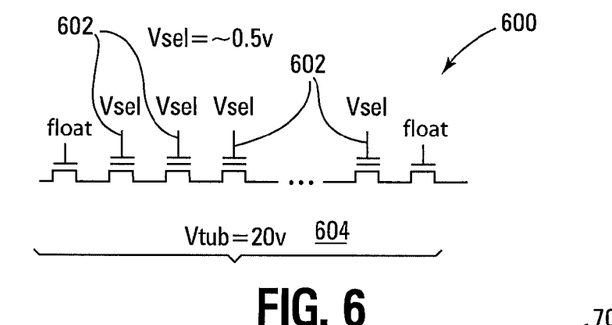
FIG. 6 is a diagram of a portion of a memory to be erased according to an embodiment of the present invention.

An erase circuit configuration 600 is shown in greater detail in FIG. 6. In the prior art, word line voltages for selected erase blocks were 0 volts. In the present erase embodiment, for a selected erase block, the voltage bias on the word line is 0.5 volts. This results in a similar improvement to that of the programming operation discussed above with respect to the string driver. In erase configuration 600, a bias voltage of 0.5 volts is placed on word lines 602 coupled to the cells to be erased, and a bias of 20 volts is placed on the tub 604.

Figure 7:
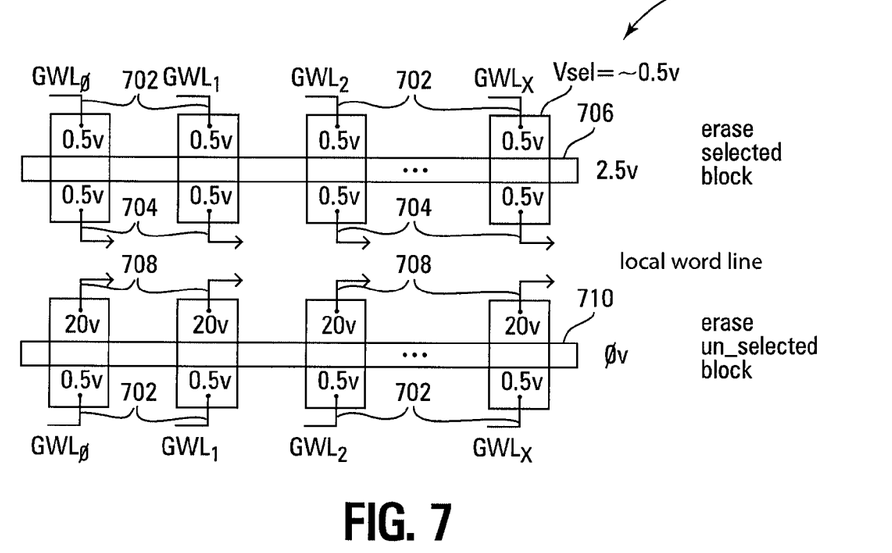
FIG. 7 is a diagram of a string driver of a memory to be erased according to the embodiment of FIG. 6.

A string driver configuration 700 for an erase operation on a selected erase block is shown in greater detail in FIG. 7. A Vsel bias of approximately 0.5 volts is applied to global word lines 702 and to local word lines 704 of the selected erase block 706. On non-selected erase blocks, such as block 710, a bias of 20 volts is applied to the local word lines 708 while the global word lines 702 are biased at 0.5 volts. In this configuration, 0.5 volts applied to the local word lines 704 and 20 volts applied to the local word lines 708 results in a positive bias on both sides of the transistors, and therefore improves field isolation.

Erasing cells in a selected erase block according to one embodiment includes applying a positive bias to selected and unselected bit lines and to a common source of the memory, and applying a positive word line voltage to all global word lines and to local word lines of the selected erase block during an erase operation.

For operations including program, read, or erase on selected blocks, all word lines or bit lines are positively biased as described above. There are no word lines or bit lines within the selected block for the operation that are biased at ground voltage, which should improve cutoff performance and field isolation. Prior art had isolation problems due to the ground biasing of the word lines and/or bit lines.

Figure 8:
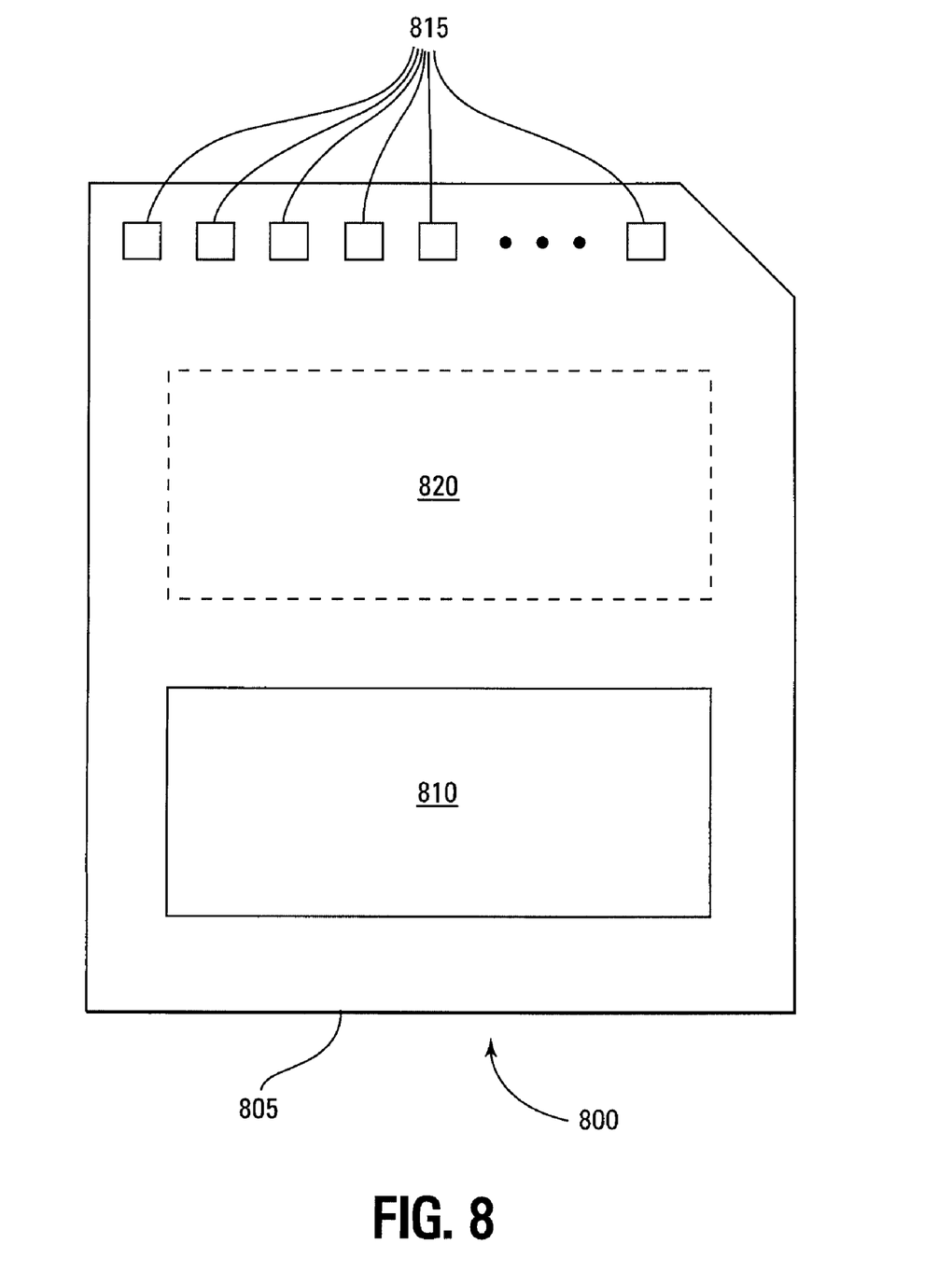
FIG. 8 is a functional block diagram of a memory module having at least one memory device in accordance with an embodiment of the invention.

FIG. 8 is an illustration of an exemplary memory module 800. Memory module 800 is illustrated as a memory card, although the concepts discussed with reference to memory module 800 are applicable to other types of removable or portable memory, e.g., USB flash drives, and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 is a non-volatile memory including a biasing scheme and configuration as described above with respect to FIGS. 2-7 according to various embodiments of the present invention. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface. In general, however, contacts 815 provide an interface for passing control, address and/or data signals between the memory module 800 and a host having compatible receptors for the contacts 815.

The memory module 800 may optionally include additional circuitry 820 which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of I/O connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC (application specific integrated circuit). Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

Biasing methods have been described that include applying a positive bias to word lines and bit lines for program and erase operations in a specific program or erase block, such as to improve cut off of string drivers and bit line drivers. In various embodiments, this biasing method back biases transistors and field devices in string drivers, such as to improve isolation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a memory device, comprising:
   applying a positive bias to access lines and data lines in the memory device for at least one of program, sense, and erase operations on a selected program, sense, or erase block; and
   back biasing string drivers for the selected block during the respective at least one of program, sense, and erase operations.

2. The method of claim 1, wherein applying a positive bias comprises applying a bias of approximately 0.5 volts to local access lines of a selected erase block during an erase operation.

3. The method of claim 1, wherein applying a positive bias comprises applying positive biases to a select gate, to word lines, and to data lines of the NAND strings of the cell to be programmed for a portion of the programming operation from a first program pulse to a last program pulse.

4. The method of claim 1, wherein applying a positive bias comprises applying a bias of approximately 0.5 volts to each of a common source and non-selected data lines of the memory device, and applying a higher positive bias to a selected data line of the memory device during a read operation.

5. The method of claim 4, wherein the positive biases on non-selected bit lines are greater than zero volts and lower than the selected bit line biases.

6. A method of programming cells in a memory, comprising:
   applying a positive bias to a select gate of a string including a cell to be programmed;
   applying a positive bias to a dataline selectably coupled to the string including the cell to be programmed;
   applying positive biases to control gates in the string including the cell to be programmed; and
   applying a programming voltage to a control gate of the cell to be programmed for a portion of the programming operation from a first program pulse to a last program pulse.

7. The method of claim 6, wherein the positive bias on the program selected bit line is approximately 0.5 volts.

8. The method of claim 6, wherein the positive biases on selected bit lines are greater than zero volts and lower than biases of the unselected bit lines.

9. The method of claim 8, wherein the positive bias on selected bit lines is approximately 0.5 volts.

10. A method of programming a cell in a memory, comprising:
    applying a positive bias to data lines and access lines of a block of memory cells to be programmed; and
    applying a programming voltage to the cell when all bit lines and word lines are positively biased during an entire programming operation.

11. The method of claim 10, wherein applying a positive bias comprises applying a bias at a program selected bit line that is greater than zero volts and lower than a bias at a program unselected bit line voltage.

12. A method of programming a cell in a memory, comprising:
    back biasing transistors in a string driver of a selected program block of the memory; and programming the cell when the transistors and field devices are back biased.

13. The method of claim 12, wherein back biasing comprises:
   applying a positive bias to each of a selected data line, an isolation transistor in a string including the cell to be programmed, a select gate, and a common source; and
   applying a bias of approximately 25 volts to a common gate of transistors of the string driver.

14. The method of claim 13, wherein applying a positive bias comprises applying approximately 0.5 volts.

15. A method of reading a cell in a memory, comprising:
   applying a first positive bias on each of a common source and non-selected data lines of a memory; and
   applying a second positive bias on a selected data line of the memory; and
   applying a read voltage to access lines of the cells to be read.

16. The method of claim 15, wherein applying the first positive bias comprises applying approximately 0.5 volts.

17. A memory device, comprising:
   an array of memory cells;
   circuitry for control and/or access of the array of non-volatile memory cells, the control circuitry configured to perform a method comprising:
      applying a positive bias to access lines and data lines in the memory device for at least one of program, sense, and erase operations on a selected program, sense, or erase block; and
      back biasing string drivers for the selected block during the respective at least one of program, read, and erase operations.

* * * * *

UNITED STATES PATENT AND TRADEMARK OFFICE
CERTIFICATE OF CORRECTION

| | | |
|---|---|---|
| PATENT NO. | : 7,724,577 B2 | Page 1 of 1 |
| APPLICATION NO. | : 12/117314 | |
| DATED | : May 25, 2010 | |
| INVENTOR(S) | : Akira Goda et al. | |

It is certified that error appears in the above-identified patent and that said Letters Patent is hereby corrected as shown below:

In claim 10, lines 6-7, replace "bit lines" with --data lines--
In claim 10, line 8, replace "word lines" with --access lines--
In claim 11, line 2, replace "bit line" with --data line--
In claim 11, line 4, replace "bit line" with --data line--
In claim 12, line 5, remove "and field devices"

Signed and Sealed this
Fourteenth Day of February, 2012

David J. Kappos
*Director of the United States Patent and Trademark Office*

UNITED STATES PATENT AND TRADEMARK OFFICE
CERTIFICATE OF CORRECTION

PATENT NO. : 7,724,577 B2
APPLICATION NO. : 11/117314
DATED : May 25, 2010
INVENTOR(S) : Akira Goda et al.

Page 1 of 1

It is certified that error appears in the above-identified patent and that said Letters Patent is hereby corrected as shown below:

Column 6, lines 57-58 (claim 10, lines 5-6) replace "bit lines" with --data lines--
Column 6, line 58 (claim 10, line 6) replace "word lines" with --access lines--
Column 6, line 61 (claim 11, line 2) replace "bit line" with --data line--
Column 6, line 63 (claim 11, line 4) replace "bit line" with --data line--
Column 7, line 1 (claim 12, line 5) remove "and field devices"

This certificate supersedes the Certificate of Correction issued February 14, 2012.

Signed and Sealed this
Twentieth Day of March, 2012

David J. Kappos
*Director of the United States Patent and Trademark Office*